United States Patent
Jevtic et al.

(10) Patent No.: US 6,580,967 B2
(45) Date of Patent: Jun. 17, 2003

(54) METHOD FOR PROVIDING DISTRIBUTED MATERIAL MANAGEMENT AND FLOW CONTROL IN AN INTEGRATED CIRCUIT FACTORY

(75) Inventors: Dusan Jevtic, Santa Clara, CA (US); Raja S. Sunkara, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/893,037

(22) Filed: Jun. 26, 2001

(65) Prior Publication Data

US 2002/0198623 A1 Dec. 26, 2002

(51) Int. Cl.$^7$ ................................................ G06F 7/00
(52) U.S. Cl. ...................... 700/228; 700/99; 700/213; 414/806; 414/940
(58) Field of Search ................................ 700/213, 214, 700/228, 255, 256, 96, 99, 100, 112; 414/800, 806, 935, 940

(56) References Cited

U.S. PATENT DOCUMENTS

| | | | | |
|---|---|---|---|---|
| 5,938,566 A | * | 8/1999 | Rodriguez-Ferre | 482/35 |
| 6,129,496 A | | 10/2000 | Iwasaki et al. | 414/222.01 |
| 6,308,107 B1 | * | 10/2001 | Conboy et al. | 700/121 |
| 6,418,355 B1 | * | 7/2002 | Kondou | 700/213 |

* cited by examiner

Primary Examiner—Khoi H. Tran
(74) Attorney, Agent, or Firm—Moser, Patterson & Sheridan LLP

(57) ABSTRACT

A method and apparatus for providing distributed material management and flow control in an integrated circuit (IC) factory. The IC factory comprises a factory stocker, a plurality of process bays and a factory transport agent for moving wafer cassettes between the bay and the stocker. Each of the bays comprises a bay stocker, a plurality of tools, a mini-stocker and a bay transport agent for moving wafers amongst the bay components. The apparatus uses partitioned stockers to facilitate deadlock avoidance or deadlock resolution. Additionally, various algorithms are used to detect wafer cassette movement situations where deadlocks may result from a wafer cassette movement within a bay and for resolving deadlocks when they occur.

3 Claims, 11 Drawing Sheets

METHOD FOR PROVIDING DISTRIBUTED MATERIAL MANAGEMENT AND FLOW CONTROL IN AN INTEGRATED CIRCUIT FACTORY

BACKGROUND OF THE DISCLOSURE

1. Field of the Invention

The invention relates to integrated-circuit fabrication techniques and, more particularly, the invention relates to a method and apparatus for providing distributed material management and flow control in a fully automated integrated-circuit factory.

2. Description of the Background Art

An integrated circuit factory comprises a plurality of process tools that function together to form a process bay. The factory may contain a plurality of bays that operate to perform various steps to process a semiconductor wafer that, taken together, form a complete integrated circuit on the wafer. Each process bay contains a bay stocker for temporarily storing cassettes of wafers that will be processed by process tools within the bay. Additionally, a bay may include a "mini-stocker" that is used for temporarily storing cassettes that are awaiting transfer from tool-to-tool. A transport agent is used to move cassettes from stocker-to-tool, tool-to-tool, tool-to-mini-stocker, mini-stocker-to-tool, and tool-to-stocker. The transport agent may be one or more robots, a human, or any other device that transports cassettes of wafers from location to location. One example of a stocker is disclosed in U.S. Pat. No. 6,129,496, issued Oct. 10, 2000.

To efficiently produce integrated circuits the stockers, mini-stockers, and tools must be controlled such that the wafer cassettes move through the factory without bottlenecks, deadlocks, or idle tools. Therefore, there is a need in the art for a method and apparatus for providing distributed material management and flow control in fully automated integrated-circuit factories.

SUMMARY OF THE INVENTION

The present invention is a method and apparatus for providing distributed material management and flow control in an automated integrated-circuit (IC) factory. The IC factory comprises a factory stocker, a plurality of process bays and a factory transport agent for moving wafer cassettes between the bay and the stocker. Each of the bays comprises a bay stocker, a plurality of tools, a mini-stocker and a bay transport agent for moving wafers amongst the bay components. The invention uses partitioned bay stockers to facilitate deadlock avoidance or deadlock resolution. Additionally, various algorithms are used to detect wafer cassette movement situations where deadlocks may result from a wafer cassette movement within a bay and for resolving deadlocks when they occur. As such, the invention facilitates distributed flow control and distributed routing of wafer cassettes through a factory.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
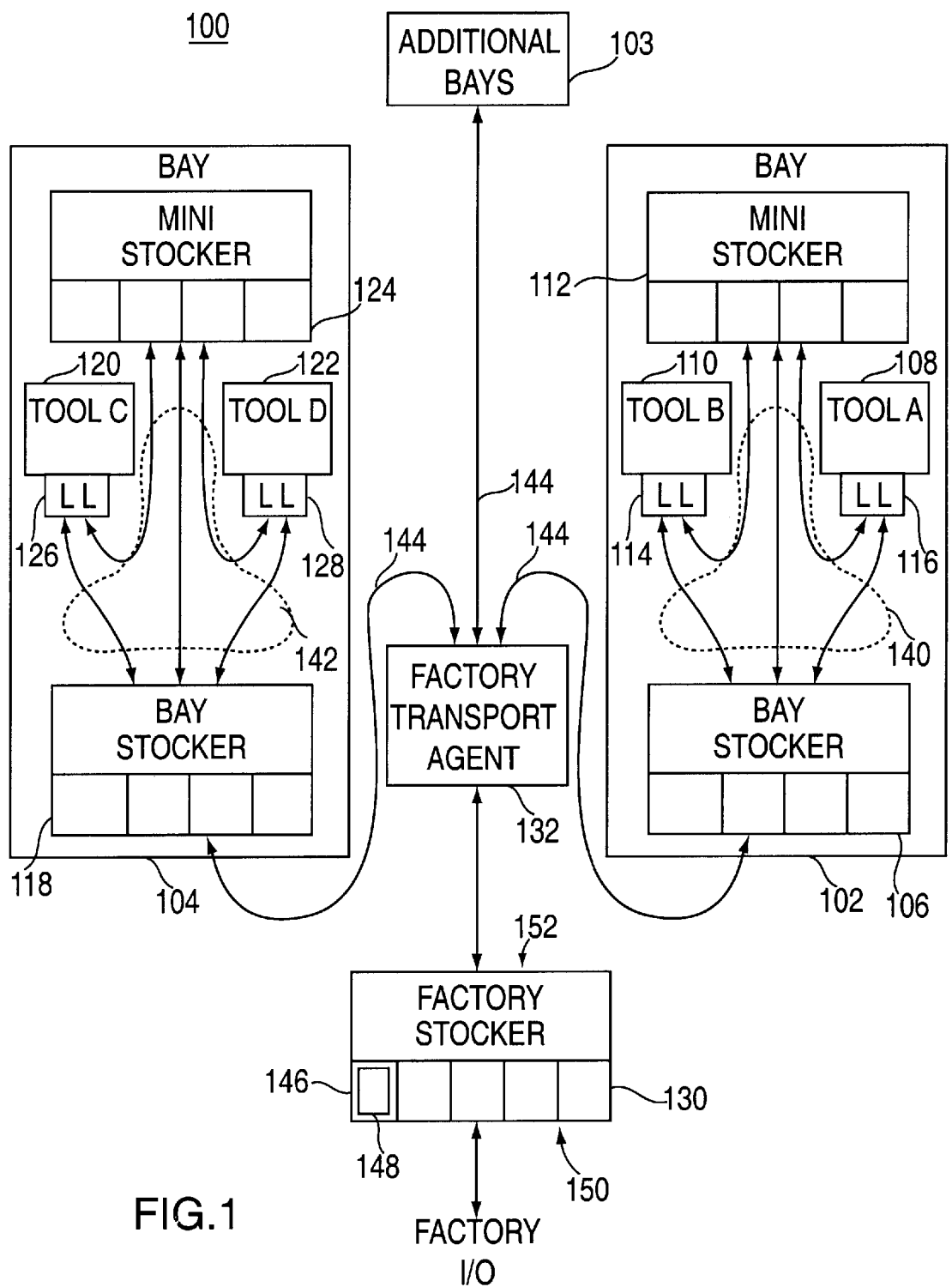
FIG. 1 depicts a block diagram of an integrated circuit factory.

FIG. 1 depicts a block diagram of an integrated circuit factory 100. The factory 100 comprises a plurality of process bays 102, 103 and 104. Although only two bays 102 and 104 are illustratively depicted, those skilled in the art will recognize that any number of bays (additional bays are represented by 103) may exist in the factory 100. The process bay 102 comprises a bay stocker 106, tools 108 and 110, a bay transport agent 140 and a mini-stocker 112. The tools 108 and 110 may comprise load locks 114 and 116 within which wafer cassettes are placed such that the tool can extract wafers from the cassette, process the wafers and return the processed wafers to the cassette. The load locks may store one or more cassettes. Examples of tools include the Mirra® chemical mechanical polishing system, the Endura® semiconductor wafer processing system, and the Centura® semiconductor wafer processing system, each of which is manufactured by Applied Materials, Inc. of Santa Clara, Calif.

In some applications such as those used in handling 300 mm wafers, the mini-stocker 112 is integrated with the load-lock or load locks of a tool to form a factory interface (FI). As such, the cassettes are moved to the mini-stocker 112 where the wafers are moved from the cassettes to the load-lock and ultimately into the tool for processing.

The second process bay 104 comprises a bay stocker 118, at least one tool (two are shown as tools 120 and 122), a bay transport agent 142 and a mini-stocker 124. Each of the tools comprises a load lock, i.e., tool 120 contains load lock 126 and tool 122 contains load lock 128.

A factory stocker 130 forms an input/output stocker (referred to as stocker 0) that handles the ingress and egress of all wafer cassettes into and out of the factory 100. The stockers (factory and bay) comprise a plurality of "ports" (for example port 146) within which a wafer cassette 148 is stored. The ports are arranged in a two dimensional array that may be accessed from opposite sides of the stocker. For example, the factory stocker 130 is accessed from one side 150 to place cassettes in each port, while the factory transport agent 132 accesses the ports from the other side 152. Such access enables smooth ingress and egress of wafer cassettes through the stockers 130, 106, 118 and mini-stockers 112 and 124.

The factory transfer agent 132 facilitates moving the wafer cassettes amongst the stockers 130, 106, and 118. Each bay contains its own bay transport agent 140 and 142 for moving cassettes amongst the tools and stockers. The transport agents 132, 140 and 142 may comprise multiple robots, humans, conveyors, or some combination of these cassette transport mechanisms. For example, a human operator may load and unload wafer cassettes into/from stocker 130. The human operator may move wafer cassettes from the stocker 130 to the bay stockers 106 and 118. Within a bay 102 or 104, a robot may move cassettes from stocker to tool. Within a tool, a transport robot moves individual wafers from the cassette(s) and amongst the process chambers of the tool. For simplicity and because they are well known in the art, the details of the process chambers and the transport robot within the tools are not shown.

In operation, wafer cassettes enter the factory 100 by loading the factory stocker 130. As indicated by the arrows 144, the transport agent 132 removes the cassettes from factory stocker 130 and moves the cassettes to the bay stockers 106 and 118. The bay stockers 104 and 118 are then accessed by the bay transport agents 140 and 142 to move cassettes from the stockers 106 and 118 to the tools 108, 110, 120, 122 and the mini-stockers 112, and 124. The tools are loaded by placing cassettes in the respective load locks 114, 116, 126, 128 where the tools then process the wafers in the cassettes and return the processed wafers to the cassettes. While transferring cassettes between tools, the mini-stockers 112 and 124 are used to temporarily store cassettes while awaiting a tool to complete processing of the wafers in a cassette. The mini-stockers 112 and 124 are known as mini-buffers or bay distributed stockers (BDS). As mentioned above, the mini-stocker may be coupled to the load lock and integrated into the tool to form a factory interface. When wafers are completely processed, the cassette of processed wafer is moved to the bay stocker and then to the factory stocker.

The forgoing describes the hardware involved in facilitating material flow through an integrated circuit factory. The hardware arrangement is supplemented by a control system that comprises individual computers, routers, hubs, and control circuits that are connected together using a local area network (LAN). The LAN may be Ethernet, a token ring, or some other form of data communications network. To facilitate efficient manufacturing of integrated circuits the hardware must be tightly coupled to the control system. The control system tracks individual wafers and cassettes using various identification tag readers throughout the factory. By tracking the location of the cassettes and wafers, the system can efficiently move wafers for processing without introducing bottlenecks or deadlocks.

Figure 2:
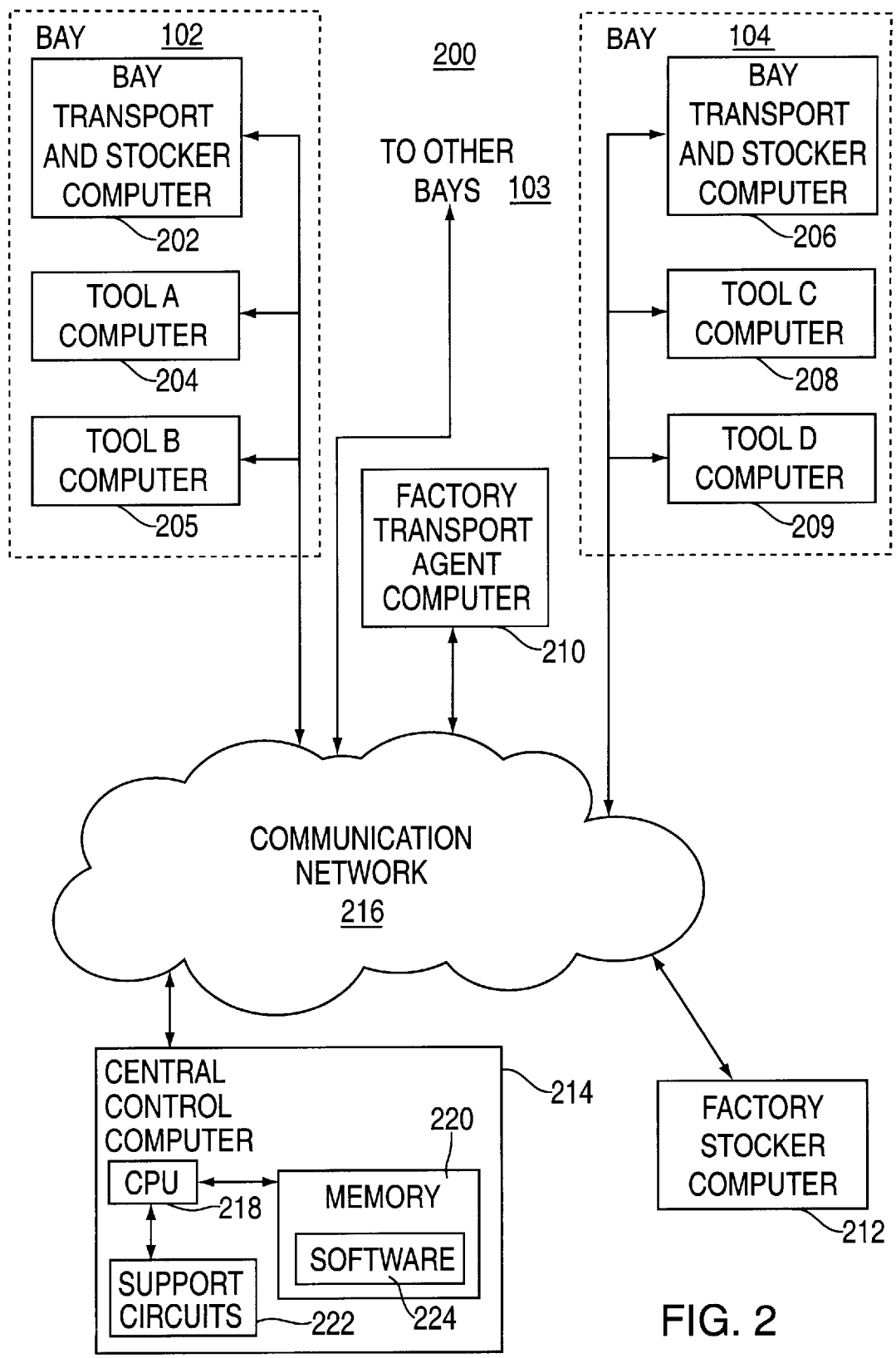
FIG. 2 depicts a block diagram of a distributed computer control system for use in the factory of FIG. 1.

FIG. 2 depicts a block diagram of an illustrative distributed control system 200 that operates with the hardware of FIG. 1. The control system 200 comprises a set of computers 202, 204 and 205 for bay 102, a set of computers 206, 208 and 209 for bay 104, a factory transport agent computer 210, a factory stocker computer 212, a central control computer 214 (also referred to herein as a host computer or host), and a communication network 216. The set of computers for the bay 102 comprises a bay transport and stocker computer 202 for controlling cassette movement through the bay and tool computers 204 and 205 that control wafer movement and processing within tool A 108 and tool B 110. Similarly, the bay 104 comprises a bay transport and stocker computer 206, a tool C computer 208, and a tool D computer 209. The factory transport agent computer 210 controls the movement of cassettes between bays 102, 103, 104 and to/from the factory stocker 130. The factory stocker computer 212 controls the operation of the factory stocker. A central control computer 214 provides command and control for all the local computers that are connected to the communication network 216. All the local computers within the factory are connected to one another via the communication network 216.

The central control computer comprises a central processing unit (CPU) 218, a memory 220, and support circuits 222. The CPU 218 may be a general-purpose computer that, when executing software 224 stored in memory 220, operates as a special purpose computer to control the factory operation. The memory 224 may be random access memory, read only memory, removable storage, disk drive, or any combination of these memory devices and circuits. The support circuits are well known circuits such as clocks, power supplies, network interface circuits, input/output devices and circuits, and the like. This conventional and well-known computer structure is also used (although, for simplicity, not shown) in computers 212, 210, 209, 208, 206, 205, 204, and 202. In some instances, the computer may be a specific purpose computer such as an application specific integrated circuit (ASIC) that performs specific control functions.

In the distributed control system 200, the central control computer provides high-level system command and control, while the other computers operate relatively autonomously. The local computers within the bays, factory stocker and factory transport agent communicate status information to the central control computer 214 such that the central control computer 214 has sufficient information to provide material flow control throughout the factory. To facilitate such flow control, the central control computer can route cassettes to various bays to distribute process loading and to avoid bottlenecks that are caused by tool malfunctions or tool maintenance.

In a factory 100 using bay stockers 106 and 118, the factory 100 has two levels of wafer cassette movement. The first level is inter-bay movement comprising wafer cassette transfers from the factory stocker 130 to/from the bay stockers 106 and 118 and between bay stockers 106 and 118. The second level is the intra-bay wafer cassette movement as the mini-stockers and bay stockers are used to facilitate moving wafer cassettes within the bays 102 or 104. If bay stockers 106 and 118 are not used, then the factory transport network is "flat" and wafer cassettes are moved directly from mini-stocker-to-mini-stocker in a point-to-point manner.

The purpose of a stocker is to "smooth out" variations in cassette traffic by storing cassette arrivals when a tool is inactive (e.g., "down" for repairs) and/or there is a mismatch in execution rates of the process steps within a bay. The size of the stocker depends on stage capacity within the bay and average equipment downtime. A stage is a set of tools that execute the same process step (a stage is also known as a family of tools).

The bay stocker capacity is calculated from a Work in Process (WIP) value that is calculated from the cycle time and cassette release rate for a factory. For example, if the cycle time for the factory is six weeks and the cassette release rate is 30,000 wafer starts per month (WSPM), the average WIP is about 45,000 wafers according to Little's formula for average values of WIP and cycle time in steady state, WIP=release_rate×cycle_time). Hence, if N is the number of bays and K is the average number of wafers per cassette, WIP/(NK) is the number of cassettes per bay stocker. For example, if there were 20 bays and 10 wafers per cassette, the factory requires each bay stocker to have a capacity of 225 cassettes.

The performance of a stocker is defined by characteristics such as the number of cassettes stored, the capacity per cassette, total stocker capacity, cassette store and retrieve times, deadlock handling capabilities, dispatching policies, the High Water Mark (HWM) of the stocker and the availability of an alternate stocker. The HWM is the percentage of stocker capacity that is reserved for outgoing cassettes, i.e., cassettes that are leaving the bay. A cassette that needs to move into a stocker from another bay can "claim" the stocker in the destination bay only if the remaining capacity in the destination stocker is greater than the HWM for the destination stocker. The HWM is generally a variable that is configured to be 20% to 30% of the stocker capacity.

The bays may be provided with an alternate stocker such that the alternate stocker is used when the bay stocker is full. The alternate stocker is supplied with "overflow" cassettes. To facilitate rapid cassette retrieval from the alternate stocker, the alternate stocker is usually the nearest stocker to the stocker that requires an alternate. As such, any overflow from the destination stocker can be stored in the alternate stocker. The cassettes can then be routed to best avoid congested bottlenecks at the destination stocker.

Distributed routing of cassettes relies on decisions that are based on local information about the subset of target tools as well as on the subset of bay stockers and mini-stockers. To facilitate distributed routing, a stocker data structure is used that defines the following four services:

Remote tool/stocker access

Cassette transfer, processing, and storing

Operator inquiry

Control messages between host, tools, stockers, and transport agents

These services facilitate stocker management, flow control, cassette routing, and deadlock handling as described below.

Figure 3:
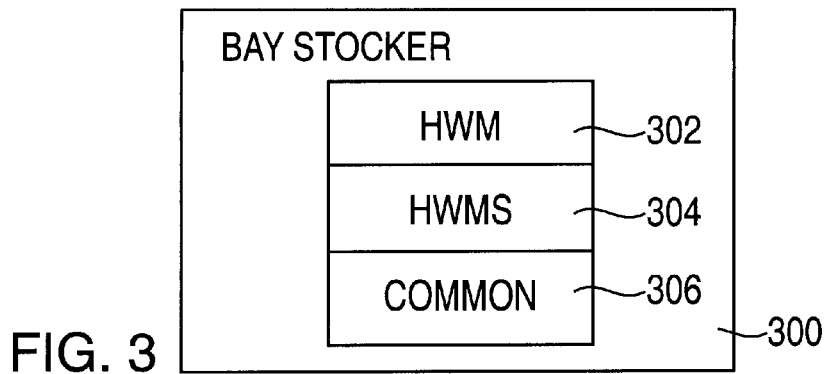
FIG. 3 depicts a block diagram of a first embodiment of a partitioned bay stocker.

In accordance with the present invention, the capacity of a stocker is partitioned into a number of sections, each section having its own utility functions, services provided, and utilization statistics. FIG. 3 depicts one embodiment of the invention wherein a bay stocker 300 is partitioned into three segments:

High water mark (HWM) partition 302

High water mark and storage (HWMS) partition 304

Common partition 306

The HWM partition 302 is generally a sub-partition of the capacity reserved for the HWMS partition 304. The HWM partition 302 is a pass-through only partition. The HWM partition 302 is used when the HWMS and common partitions 304 and 306 are full or nearly full. The HWM partition 302 is used by cassettes that are arriving into the bay or leaving the bay provided the cassettes' destination is empty, i.e., the destination tool, bay stocker, or mini-stocker is able to accept the cassette without requiring the cassette to be stored in the HWM partition 302. Additionally, the partitions may be further partitioned into in and out portions referred to as the in-stocker and the out-stocker. As their name implies, the in-stocker is reserved for cassettes entering the bay or tool and the out-stocker is for tools leaving the bay or tool.

The HWMS partition 304 is used for cassette placement when the common partition 306 is full. The HWMS partition is also used to resolve deadlocks resulting from process routing or deadlocks due to employment of priority based scheduling logic that controls the movement of cassettes. The use of the HWMS partition in these situations is discussed below. Furthermore, the HWMS partition 306 is used to store WIP from within the bay as well as to enable the WIP to leave the bay.

The common partition 306 is used for cassettes arriving into the bay or cassettes leaving the bay. If the common partition 306 is nearly full, the bay stocker 300 stops accepting cassettes from other bay stockers including the factory stocker until space is available in the stocker 300. The HWM partition 302 is used to pass cassettes out of the bay until common partition space is available for accepting new cassettes.

Each of the stocker partitions 302, 304, and 306 are regarded by the central control computer 214 as an individual stocker and assigned a capacity. The common partition 306 is used for normal cassette transfer for inter-bay and intra-bay transfers. When the common partition becomes full, the HWMS partition 304 is used intra-bay transfers and inter-bay high water mark transfers. The HWM partition is reserved for inter-bay transfers only, i.e., clearing cassettes from the bay. The computer 214 maintains a database of stocker utilization statistics. The utilization statistics for each partition are independently recorded for use in cassette flow control by the control computer 214.

There are two situations in which deadlocks within a bay may occur. The first is a circular wait that arises when a processing loop is formed. The second situation arises from cassettes having different priorities vying for processing in the same tool when using priority based scheduling for cassette movement.

A simple example of the first deadlock situation involves two tools that have no space to receive any additional cassettes. If there is a cassette in tool A that is to be moved to tool B and a cassette in tool B that is to be moved to tool A, the system has a deadlock known as a circular wait, i.e., each tool is awaiting the other tool to move a cassette. To clear a circular wait, an operator must move one of the deadlocked cassettes to a mini-stocker, bay stocker, or a transport agent, and then move the other cassette. Below, an algorithm is presented for detecting a circular wait and resolving a corresponding deadlock.

The second deadlock situation arises when a priority-based scheduling technique is used. In a priority-based schedule, the cassettes are assigned priorities that define the movement of the cassettes through the factory. As such, high priority cassettes are moved and processed in advance of lower priority cassettes. A deadlock occurs when cassettes in a bay that have been processed by tool A and are awaiting movement to a target tool (e.g., tool B) within the same bay. As such, tool A's load locks are full. If a high-priority cassette enters the bay through the bay stocker and is destined for tool B and if the bay stocker is now full, a cassette of tool B has no place to be moved so that the priority cassette can be moved into tool B. The tool A cassettes cannot move, because the new cassette has a higher priority and needs to be moved first. Consequently, a deadlock occurs.

Figure 4:
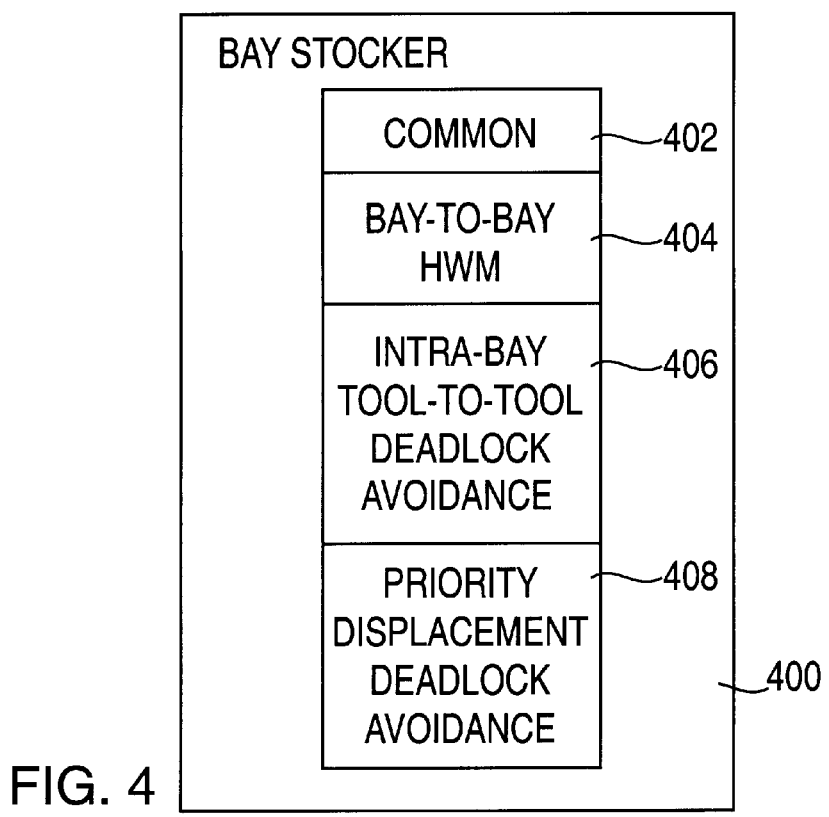
FIG. 4 depicts a block diagram of a second embodiment of a partitioned bay stocker.

To mitigate either of these deadlocks, the invention uses either a deadlock avoidance technique or a deadlock detection technique followed by a deadlock resolution technique. To facilitate deadlock mitigation, as shown in FIG. 4, the bay stocker 400 is divided into four partitions:

Common partition 402

Bay-to-bay high water mark 404

Intra-bay tool-to-tool deadlock avoidance partition 406

Priority displacement deadlock avoidance partition 408

The common partition 402 is used for normal operation of the bay stocker 400 such as transfers from tool-to-tool within the bay and for cassettes exiting the bay. If the common partition 402 reaches a trigger level of "one cassette less than full", the remaining single space is reserved for outbound cassettes (cassettes needing to exit the bay). This trigger invokes the use of the priority displacement deadlock avoidance partition 408. The partition 408 is used for cassettes that are being transferred to a tool within the bay. That is, partition 408 is used for cassettes that are not exiting the bay, nor using intra-bay tool-to-tool deadlock avoidance.

The priority displacement deadlock avoidance partition 408 is space in the bay stocker 408 for cassettes that are active in the bay but which cannot be placed either on their next tool within the same bay, nor in the common partition 402 of the stocker because the stocker is full. The partition 408 is different than the intra-bay tool-to-tool deadlock avoidance partition 406 because the partition 408 allows the cassettes to reside in the partition 408 without obtaining space at the destination tool. As such, these cassettes may reside in the partition 408 indefinitely.

If the priority displacement deadlock resolution partition 408 fills to one space less than capacity (the last space is reserved for deadlock resolution), then no other cassettes may arrive at the common partition of the stocker until an open location in the common partition 402 is provided (i.e., a cassette leaves the bay). During this "no admittance" period, cassettes that are in the bay and involved in a circular wait may be worked on to resolve the circular wait using the intra-bay tool-to-tool deadlock avoidance partition 406. An operator is notified by the central control computer displaying or printing a warning that the common partition use has been disrupted.

To create an intra-bay tool-to-tool deadlock avoidance partition 406, the capacity (measured in the number of cassettes) need only be equal to the number of tools in the bay. This partition 406 is used for temporary cassette placement to provide space for cassettes that need space en-route to a destination tool that is also trying to trying to move a cassette to the tool of departure, i.e., tool A and tool B need to trade cassettes.

By dedicating a "trading ground" for the swapping of cassettes, the system avoids interference of other bays and provides dedicated stocker space for in-the-bay deadlock resolution.

The bay-to-bay HWM 404 is reserved for bay-to-bay cassette transfers.

Figure 5:
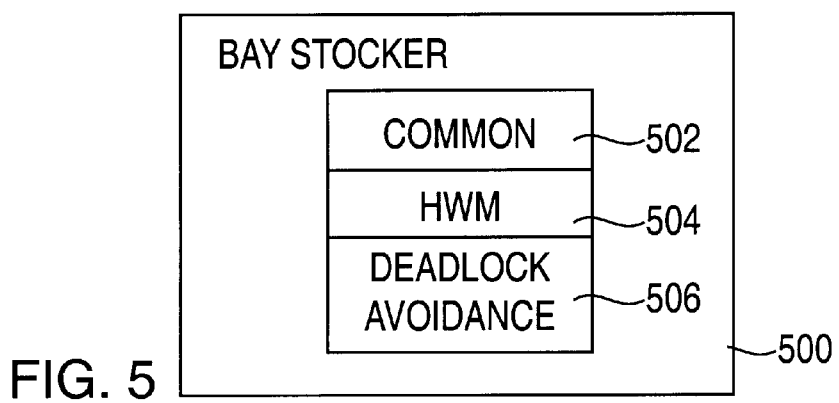
FIG. 5 depicts a block diagram of a third embodiment of a partitioned bay stocker.

To simplify the stocker structure and the overhead needed to coordinate cassette movement, the partitions may be combined to form three partitions. As depicted in FIG. 5, the three partitions of the bay stocker 500 are:

Common partition 502

High water mark partition 504

Deadlock avoidance partition 506

During normal operation, the incoming and outgoing cassettes of a bay use the common partition 502 of the bay stocker 500. In addition to the common partition 502, the outgoing cassettes can use the total capacity of the stocker (any partition 502, 504 or 506) while incoming cassettes are restricted to the common partition 502. The HWM partition 504 is reserved for use by cassettes leaving the bay such that a path out of the bay is always available. The deadlock avoidance partition 506 performs the deadlock avoidance and resolution functions discussed above, i.e., space is always available for clearing circular waits or other deadlocks.

Stocker control may be centralized or decentralized (distributed). The space allocation for cassettes within the stocker that are associated with fabricating a specific product can be configured by a centralized "agent", e.g., the central control computer of FIG. 1. The central control computer sends a command to the stocker computer to request the stocker management software provide space for a particular product (Product $P_K$).

Figure 6:
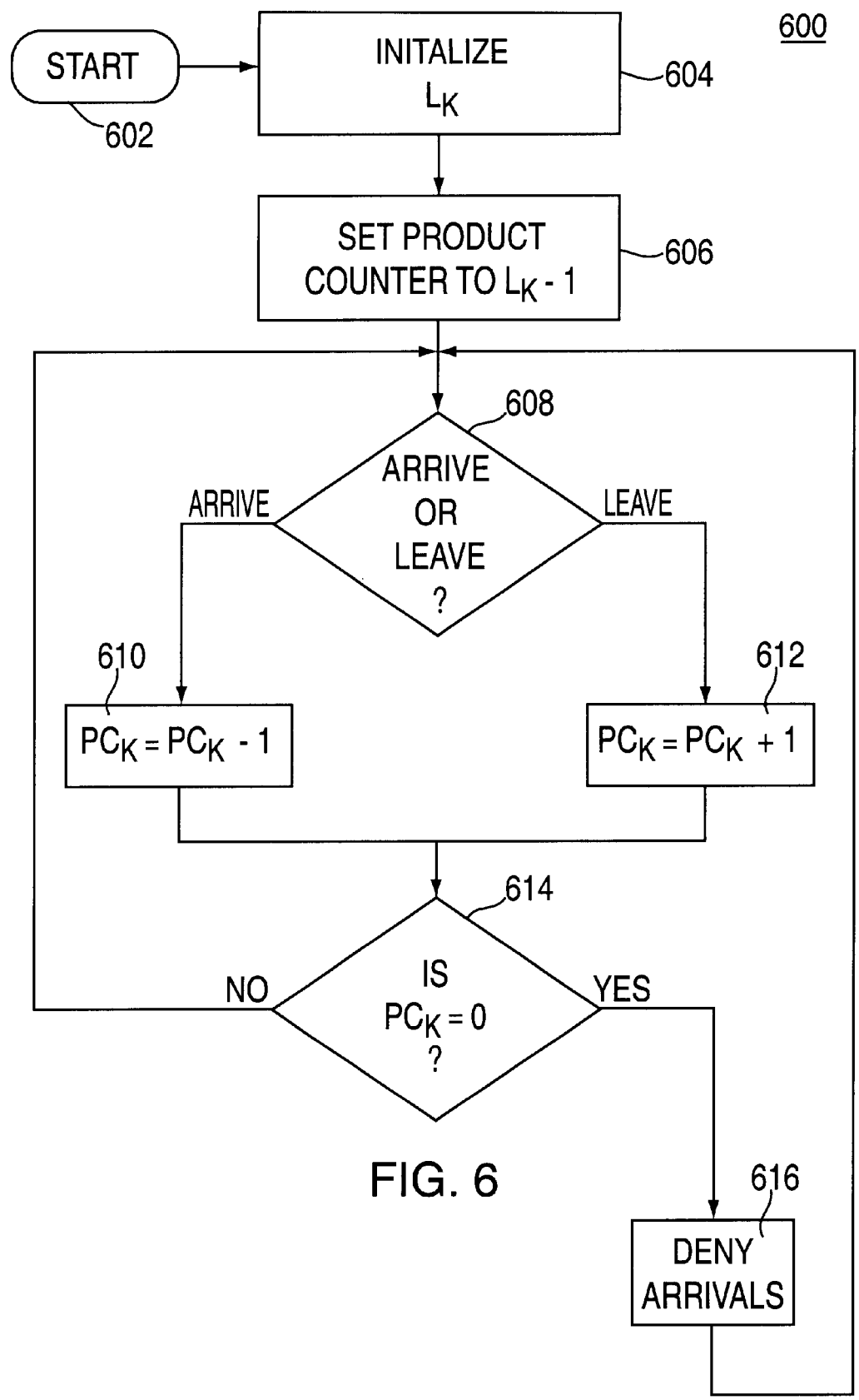
FIG. 6 depicts a flow diagram of a process for mitigating deadlocks in a bay.

Alternatively, the space allocation can be performed in a decentralized manner using a dynamic allocation algorithm that is executed on the stocker computer. FIG. 6 depicts a flow diagram of a routine 600 that assigns and tracks space utilization within a stocker on a product-by-product basis. This routine facilitates cassette flow control and cassette congestion management within a factory. The routine 600 begins at step 602 and proceeds to step 604 where the product partition for product k is initialized. The initialization value (the initial space allotment for cassettes for product k is $L_k$) is based upon the number of products, product priority, and product volume (i.e., the number of wafers and cassettes comprising the product). At step 606, the product counter is set to $L_k-1$. At step 608, the routine 600 queries whether a cassette for product k is arriving or leaving. If the cassette is arriving, the routine 600 proceeds to step 610 wherein the product counter for product k is decremented by one. If the cassette is leaving the bay, the product counter is incremented by one at step 612.

At step 614, the routine 600 queries whether the product counter value equals zero. If the query is negatively answered, the routine 600 proceeds to step 608 to await the next movement of the cassettes. If the query at step 614 is affirmatively answered, the routine 600 proceeds to step 616. At step 616, the routine sets a flag that causes the bay stocker to deny arrivals of cassettes for product k. The flag is maintained until the product counter is greater than zero indicating that the partition of the stocker for product k is no longer full. Once the flag is set, the routine 600 proceeds to step 608 to await the next cassette transfer.

To facilitate effective routing of cassettes, a communication protocol is used to enable the stocker and tool computers to access information regarding other stocker and tools. Thus, any stocker or tool computer knows the status of other tools and stockers. As such, decisions can be made to transfer cassettes based upon variables such as stocker loading percentage, cassette age, cassette priority, distance traveled by the cassette, and so on. A cost matrix can be readily derived from the weighted sums of these variables.

Figure 12:
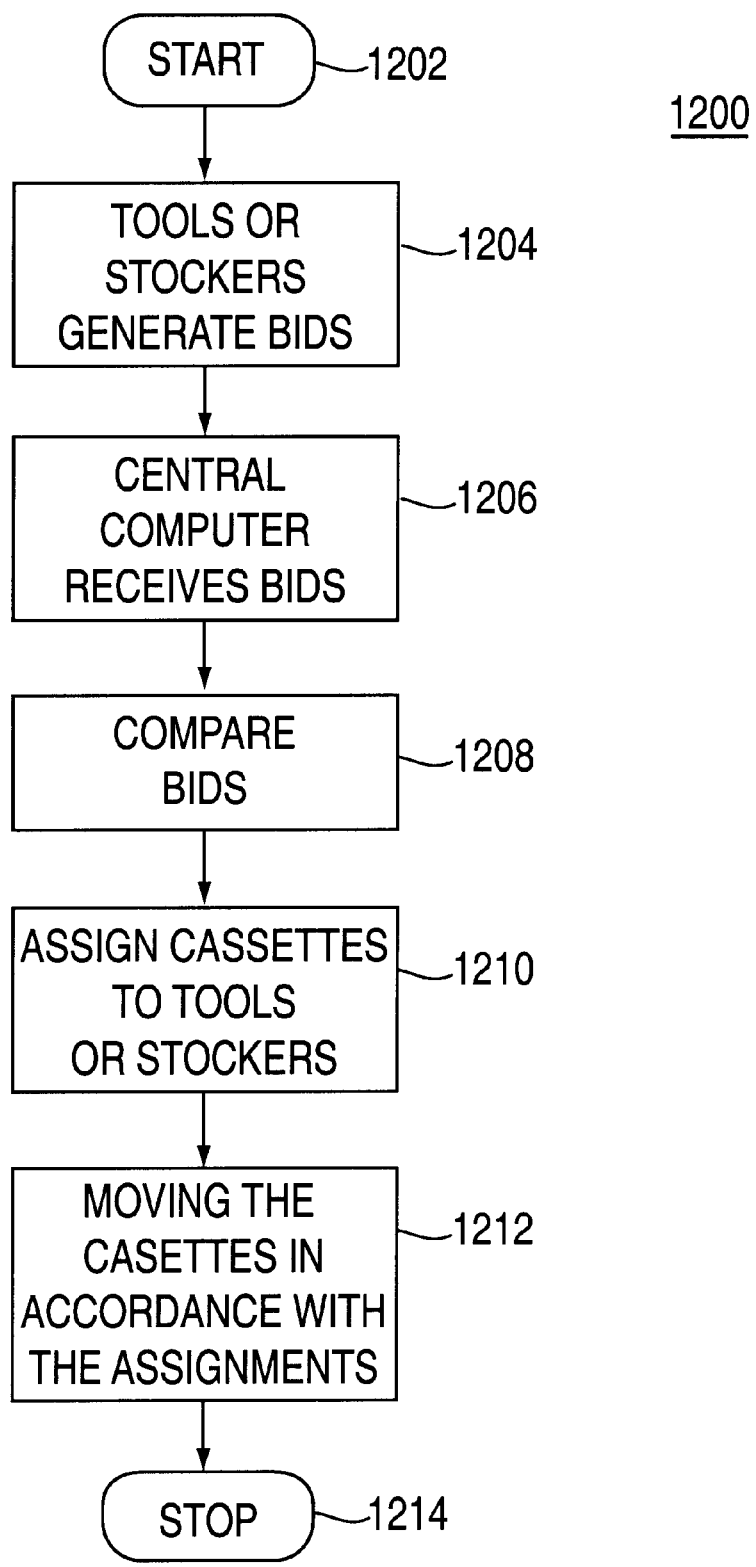
FIG. 12 depicts a flow diagram of a method for providing material flow control that facilitates congestion management in an integrated-circuit factory.

FIG. 12 depicts a flow diagram of a method 1200 for providing material flow control that facilitates congestion management in an integrated-circuit factory. The method begins at step 1202 and proceeds to step 1204. In step 1204, the tools "bid" on the available cassettes. Each bid contains the maintenance schedule for the tool, the tool's capacity, the tool's present backlog, and so on. Each tool's bid also identifies that a cassette of a particular priority will be finished before a certain time. At step 1206, the bids are sent to and received by the central control computer or a central computer for all tools of a particular type. The central computer then, at step 1208, compares the bids of the various tools and, at step 1210, decides which tool is best suited for processing an available cassette of wafers located in the bay stocker. At step 1212, the assigned cassettes are transferred to the identified tools in accordance with the cassette assignments. The method 1200 stops at step 1214.

Alternatively, the tool computers can periodically export their status to the central control computer. Such status information includes process times, configuration, throughput, threshold values regarding the tool's ability to accept a cassette or not, stage number, and present load values. The tool also acknowledges whether it is idling or will be idling within T hours. The number of hours is determined from the ratio of the number of cassettes remaining to complete processing and the tools throughput. Consequently, the cassettes are automatically assigned to the tools without using a bidding process.

Stockers may also bid for cassettes in the same manner that tool's bid for cassettes. As such, a stocker can request cassettes from the central control computer such that a sufficient level of WIP is distributed amongst all stockers and bottlenecks are avoided.

Congestion control is facilitated by various processes including:

1. Careful planning and allocation of resources
2. Restricting the total WIP
3. Implementing some form of flow control
4. Choking-off the input of cassettes
5. Using single wafer transport and process concepts.

Resource allocation can be used to form a virtual path for any given cassette that defines every step through the factory for the cassette. The virtual path can be defined before the cassette has been moved from the factory stocker. A bundle of virtual paths comprises a set of actual trajectories a cassette may take through the factory.

Restricting the WIP is a form of congestion control. The number of cassettes may be kept constant by allowing a constant number of "permits" to circulate in the factory. Each permit represents an authorization for a cassette to enter the factory and be processed. A new cassette must first capture a permit and destroy it to enable the cassette to enter the factory. When a cassette exits the factory, the permit is regenerated. As such, there is a constant number of permits that, in turn, allows only a constant number of cassettes to be circulating in the factory. The same technique can be used to limit the number of cassettes in any stage within the factory or bay. To combat against specific bottlenecks within the factory, a local work-load balancing algorithm can be employed.

Choking off the input is achieved by backward propagation of a message from computer to computer that states "don't send any more wafers". This message propagates from a congested bay stocker that is furthest down stream all the way up to the source of wafers, if needed. To know when to send this message, the stocker computer may monitor its percentage of utilization per product. So with each product P, the system associates a real variable $u_P \in \{0,1\}$ that would reflect recent occupancy of a stocker by product P. To maintain a good estimate of $u_P \in \{0,1\}$, the system can use an Exponentially Weighted Moving Average (EWMA) estimator having the form:

$$\hat{u}_P^{i+1} = (1-\alpha_P) \cdot \hat{u}_P^i + \alpha_P \cdot u_P^i$$

where parameter $\alpha \in \{0,1\}$ expresses the effect (weight) of recent utilization history on the predicted value of utilization in the next time interval for product P and $u_P^i$ is a stocker utilization sample at time t.

Figure 13:
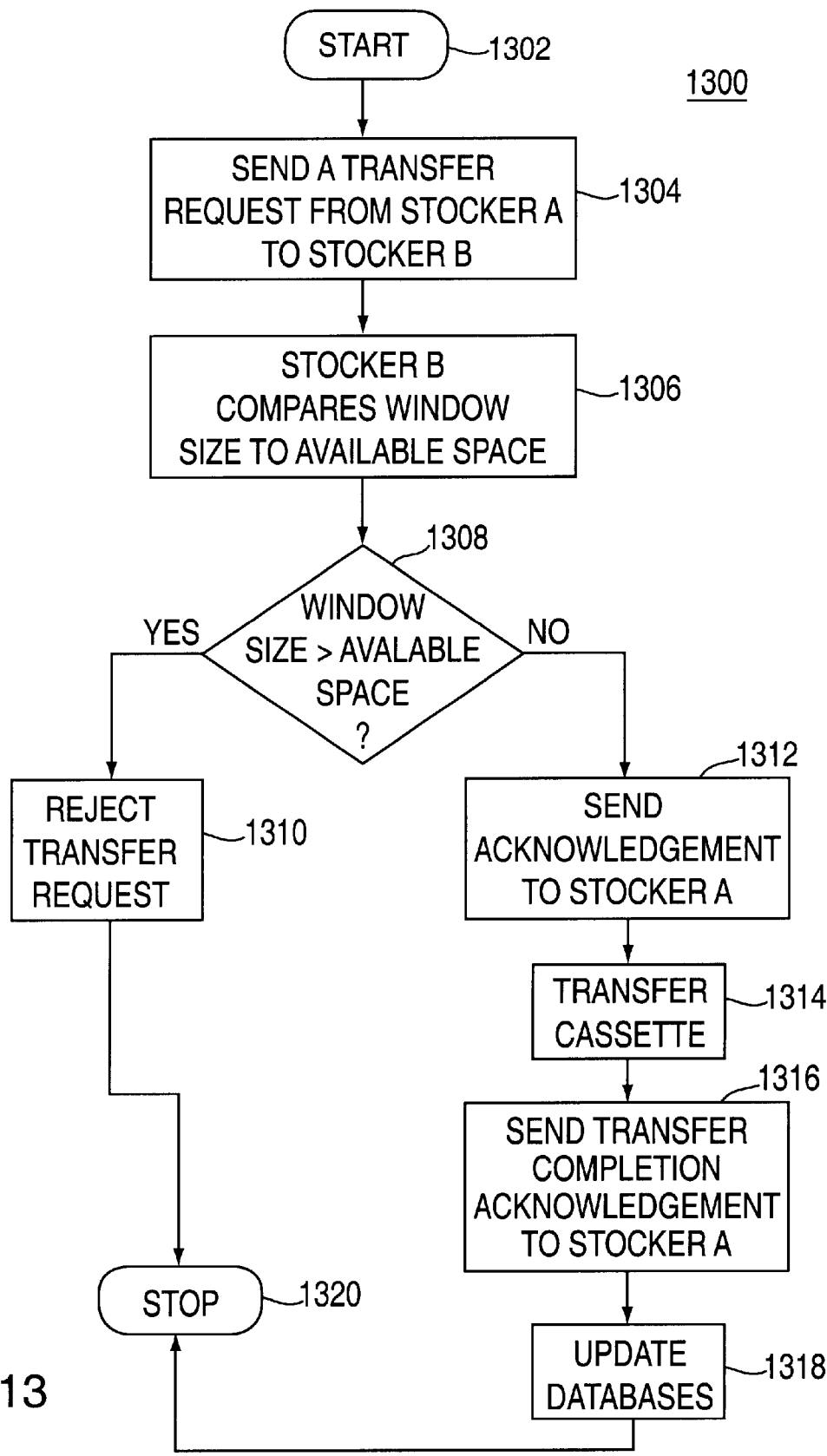
FIG. 13 depicts a flow diagram of a method for providing overflow protection to facilitate congestion control in an integrated-circuit factory.

Overflow protection can be achieved using a form of sliding window protocol. FIG. 13 depicts a flow diagram of a method 1300 for providing overflow protection to facilitate congestion control in an integrated-circuit factory. The protocol operates on the basis of one stocker requesting that certain space be reserved in another stocker. The method begins at step 1302 and proceeds to step 1304. At step 1304, stocker A sends an inquiry (a transfer request) to stocker B. The inquiry delineates a number of cassettes of a given product that stocker A would like to send to stocker B. The number of cassettes is referred to as a window size. At step 1306, the method compares the window size to the available space in stocker B. At step 1308, the method queries whether the window size is greater than the available space. At step 1310, stocker B rejects the transfer if the window size cannot be accommodated or the window size is not appropriate from the product, i.e., sometimes cassettes that belong to a certain product are requested to travel in a group. If stocker B can accommodate the transfer, at step 1312, an acknowledgement is sent to stocker A and, at step 1314, the transfer proceeds. Once the transfer is complete, stocker B sends, at step 1316, an acknowledgement to stocker A. Upon the completion acknowledgement being sent, the method, at step 1318, updates the databases of each stocker to reflect the transfer. The method 1300 ends at step 1320 from either steps 1310 or 1318.

Window size is the parameter that is used to manage material overflow. When the window size is set to one, only one cassette at a time can be transferred and accumulation of cassettes is not possible.

Deadlock Handling

A set of one or more tools that run the same process is called a stage (or a family, or a process step). The size of a stage is the number of tools comprising the stage. A process flow is serial if each stage has exactly one tool. A process flow is parallel if it is comprised of exactly one stage and it is mixed if it has at least two stages and at least one stage has size greater than one.

If the same process name appears more than once in the processing sequence, the sequence forms a processing loop. Processing loops are mapped onto the set of tools such that the process flow graph will have a loop as well. For example, the mapping of the 3-process sequence $P_1,P_2,P_1$ onto the set of two chambers $\{C_1,C_2\}$ is the smallest such mapping. Note that if $P_1,P_2,P_1$ is mapped onto $\{C_1,C_2C_3\}$ as $P_1 \rightarrow C_1$, $P_2 \rightarrow C_2$, and $P_1 \rightarrow C_3$, the material flow (wafer flow) will not contain a loop even though the corresponding processing sequence does. Also note that a wafer flow may contain a loop even though the corresponding processing sequence does not (e.g. when $P_1,P_2,P_3$ is mapped onto $\{C_1,C_2\}$ as $P_1 \rightarrow C_1$, $P_2 \rightarrow C_2$, and $P_3 \rightarrow C_1$).

As shown above, if processing loops are mapped onto the smaller set of tools, the material flow will have a loop as well. In that case, there must be a tool whose name appears in at least two different stages. Such tool is called a knot tool. For example, in a flow $LL \rightarrow C_1 \rightarrow C_2 \rightarrow C_3 \rightarrow C_4 \rightarrow C_2 \rightarrow LL$, tool $C_2$ is the knot tool. This flow has a loop of length three. A situation in which tools $C_2,C_3$ and $C_4$ all have cassettes in them is called a circular wait. If there is no tool preemption by a transporter, this circular wait becomes a deadlock. The purpose of this invention is to present techniques dealing with either avoiding or detecting and subsequently resolving (breaking) deadlocks in fully automated (also known as "lights-out") integrated-circuit factories. These techniques are deadlock avoidance, detection of a circular wait, and deadlock resolution.

Deadlock Avoidance

A system state is "safe" if a scheduling program allocates tools to each of the cassettes and still avoids a deadlock. A deadlock state is an "unsafe" state. The converse is not true (i.e., an unsafe state is not necessarily a deadlock state). If the system is in an unsafe state, then there is a scenario (order of allocation) that may lead to a deadlock state. A deadlock avoidance technique is based on denying tool acquisition in an unsafe state (so that system will never enter the deadlock state). A deadlock avoidance algorithm examines either a) the state of the requested tool, or b) the state of the loop to assure that there will never be a circular wait condition. Thus, the following two options exist:

a) Deadlock avoidance by tool reservation;
  b) Deadlock avoidance by deadline scheduling.

Figure 7:
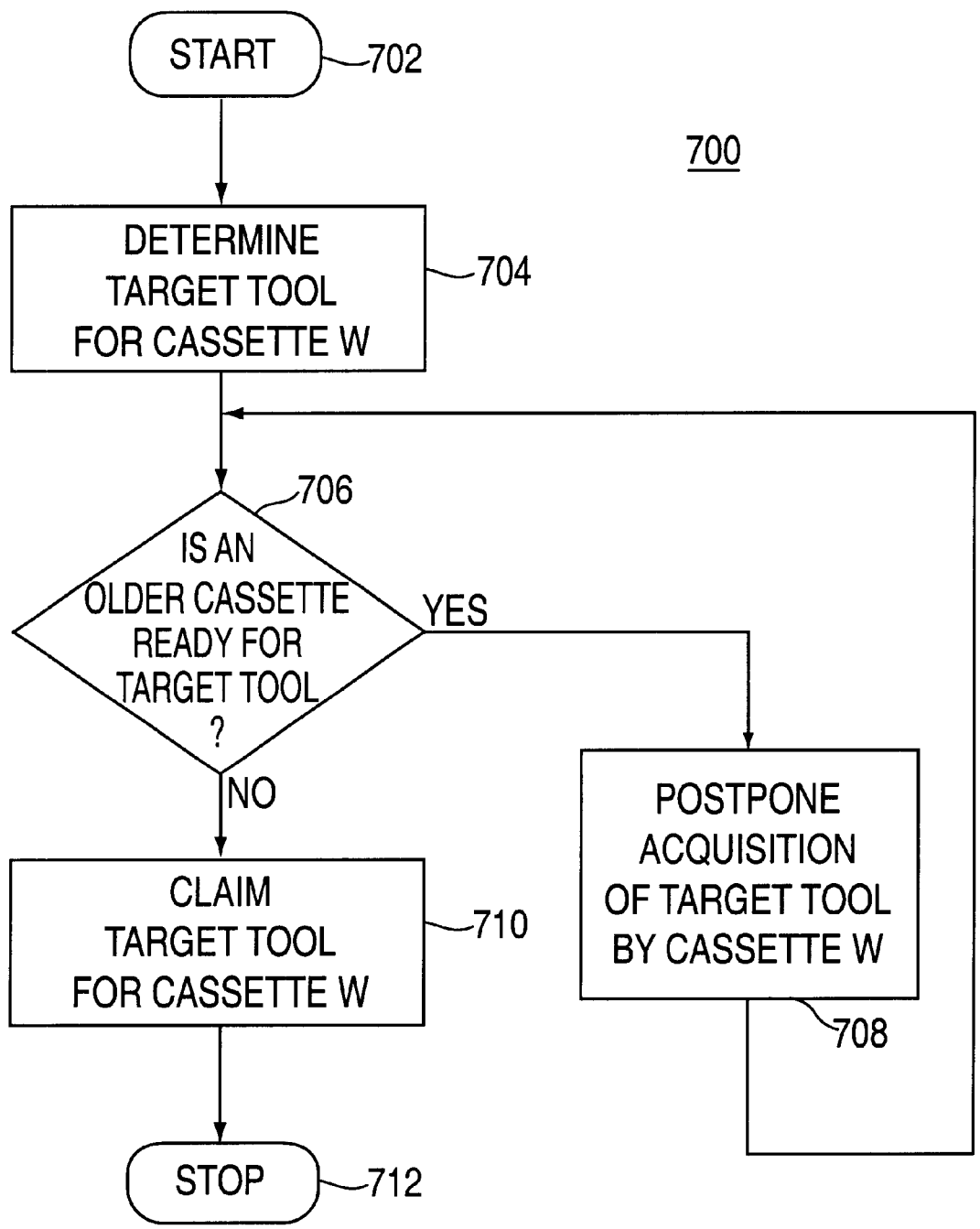
FIG. 7 depicts a flow diagram of a process for performing deadlock avoidance.

An example of (a) above that uses a one-step look-ahead process is depicted as a flow diagram in FIG. 7. The process 700 begin at step 702 and proceeds to step 704. At step 704, after cassette W finishes processing, its target tool movement is determined. A check is performed at step 706 on the target tool of W to determine whether there is another cassette that is older which will use this tool in its next step. If so, the acquisition of the target tool by W is postponed at step 708. (Clearly, in this case, W's target tool is the knot tool.) Thus, the knot tool is claimed at step 710 by W only if there is no older cassette with a prior claim (reservation of the knot tool. The process 700 stops at step 712.

It is possible to extend the operating domain of the forgoing technique to multiple and/or nested loops as well as to improve the run time performance of the above algorithm by Hierarchical ordering of cassette requests;

Checking (before acquisition) only knot tools (rather than every tool).

Note that deadlock avoidance by deadline scheduling is not possible if positions of knot tools change dynamically and the associated data structure (e.g., digraphs representing the material flow) does not follow that change.

Another way to avoid circular waits is to compare the loop capacity with number of cassettes in the loop. To prevent circular wait, the algorithm should maintain the number of cassettes in the loop smaller than the capacity of the loop. So, a cassette outside the loop will be able to acquire a knot tool, only if, at the instance of acquisition, the capacity of the loop exceeds the number of cassettes in the loop by at least two. This can be implemented by adding a new state "busy deadlock" to the knot tool (in addition to busy-processing and busy-maintenance). The flag is set whenever there are N−1 cassettes in a loop whose capacity is N cassettes. Thus, a knot tool (or a stocker) should have a counter whose value increases by one when cassette enters and decreases by one when cassette leaves the loop. Clearly, the scheduling algorithm should only be slightly altered to take this new state into account.

Deadlock Detection

Under "deadlock detection", a process detects a circular wait. This detection is the preliminary step in resolving (breaking) a deadlock. Depending on the status of tools in the loop (finished processing or not), two algorithms are used in deadlock detection.

The first algorithm (DD1) returns Boolean yes if there is a circular wait and no if there is not a circular wait involving a given cassette. If there is a circular wait, the algorithm also returns all cassettes and tools involved in the circular wait. A cassette that has completed processing and is ready to leave its tool initiates (activates) the algorithm. Other cassettes involved in a circular wait do not have to be ready to leave their respective tools; they may still be in the state "being processed".

The second algorithm (DD2) returns the knot tool if there is a circular wait involving cassettes that are all being processed (and thus each of them is ready to leave their respective tool). It is run every time a cassette is finished processing regardless of its position in the process flow.

The choice of a deadlock detection algorithm to be deployed depends on what one wants to do once a circular wait is detected. In order to proceed, either at least one cassette must be taken out of the processing loop into a discretionary place or a transport agent must be able to swap cassettes and thus resolve the deadlock. An empty place dedicated to (temporarily) holding cassettes from the processing loop is known as a Penalty Box (PB) (e.g., a deadlock avoidance partition 406, 408, or 506 of FIGS. 4 and 5, hereinafter referred to generally as a deadlock handling partition). A cassette chosen to leave the processing loop is referred to as a "victim cassette" or just a victim.

In algorithm DD1, victim can be any cassette in the processing loop that is ready to leave its tool. This includes the cassette that initiated the execution of DD1 to discover that it is involved in a circular wait. When a cassette W in the tool $C_w$ finished processing, algorithm DD1 is run to check if there is a circular wait. A circular wait (involving W) is detected when all of the possible tools W could be routed to in the future steps have cassettes inside them (are full) and at least one of these cassettes has tool $C_W$ as its target tool. If this occurs, a circular wait already happened or it is about to happen. Among all cassettes that finished processing, one or more cassettes will be moved out of the loop and put into the deadlock handling partition. The choice of victim cassettes(s) should be made so that the throughput is maximized. Clearly, potential victim cassettes occupy different positions in the process flow, have different positions with respect to transport agent, and have different remaining processing time. So, it must be relevant which one is sent into the deadlock handling partition. This choice can be made with respect to 1) the length of processing times, 2) tool position, 3) remaining time in the loop, and so on, by running a throughput simulator. The optimum choice of victim cassette(s) with respect to tool's throughput is determined by an exhaustive off-line search.

In all algorithms below, succ(X) denotes the target tool for the cassette in tool X. Note that in serial process flows with one processing loop (simple loops, succ(X) is unique for all values of X except when X is a knot tool.

Algorithm DD1.

Figure 8:
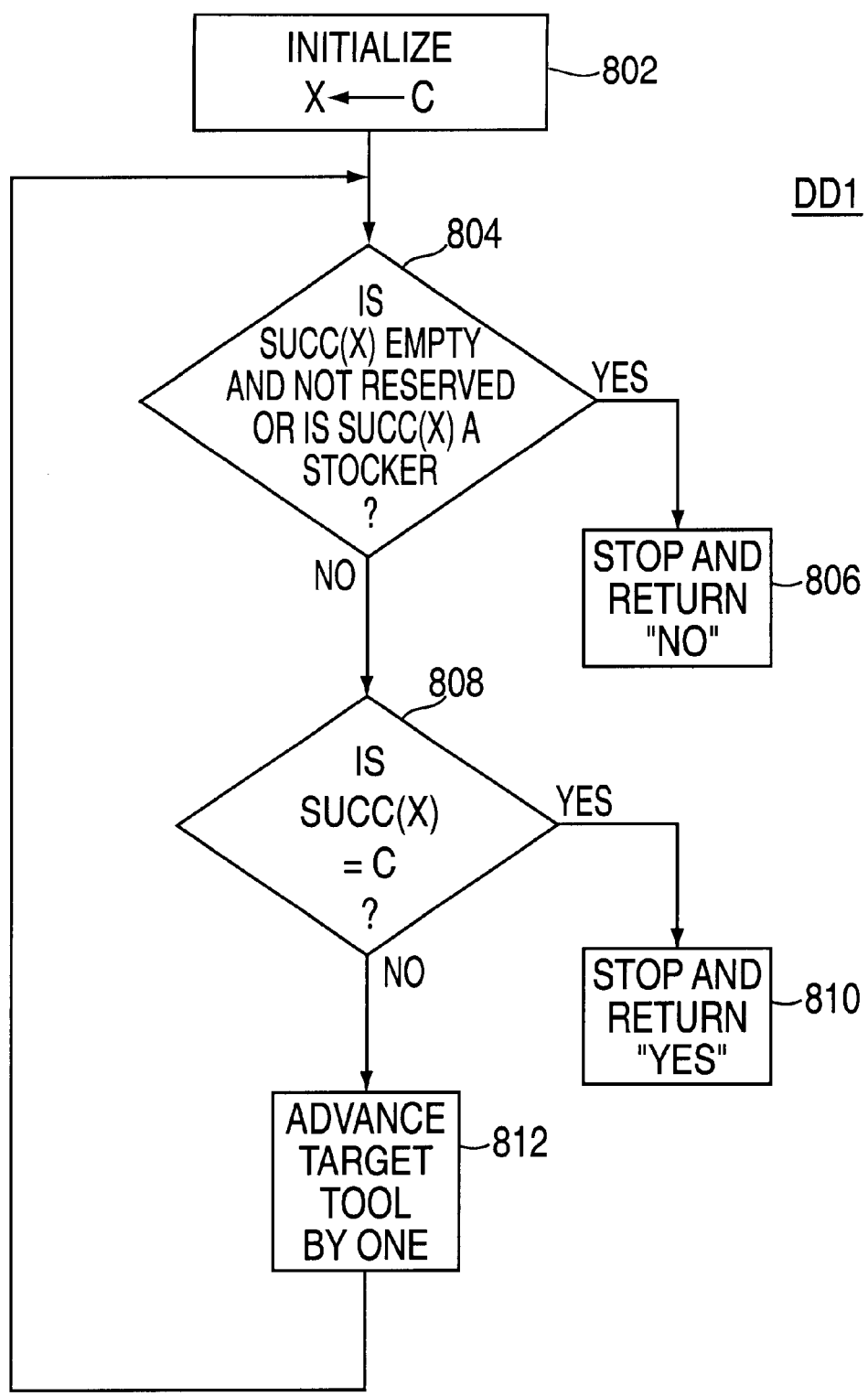
FIG. 8 depicts a flow diagram of a first embodiment of a process for detecting deadlocks.

The algorithm DD1 is shown as a flow diagram in FIG. 8.

Step 802. (Initialize.) If tool C is finished processing, record C, mark C done, put X←C and go to Step 804. (X is now a loop variable with initial value C.)

Step 802. If succ(X) is empty and not reserved or succ(X) is a stocker, then go to Step 806. Else, go to step 808.

Step 806. If succ(X)=C, go to Step 810. Else, go to Step 812.

Step 808. Stop. Return NO. (Circular wait not found.)

Step 810. Stop. Return YES. (Circular wait found. Return all cassettes involved in the circular wait. Return subset of tools that are finished processing (tools which, in addition to tool C, are marked done).

Step 812. (Advance the target tool by one.) X←succ(X). Record X. If X is finished processing, mark X done. Go to Step 804.

The above algorithm DD1 requires storing an adjacency matrix (or adjacency list) or a data structure from which an adjacency matrix can be derived. When adjacency matrix is used, the run-time complexity of the above algorithm DD1 is O(n), where n is the number of tools.

In Algorithm DD2, a victim is a cassette from the knot tool. If all cassettes are finished processing and the system is deadlocked, it makes sense to remove the cassette from the knot tool first (in order to enable the shift of cassettes in the loop by one position).

To identify the knot tool, each tool in the process flow is examined to see if it is a target tool of a downstream cassette.

For example, if tools are denoted as $C_1, C_2, \ldots, C_n$, in the order implied by the process flow, the general form would be similar to the algorithm below:

1. (Initialize.) i←1 and k←1. Go to Step 2.
2. If i=n+1, then stop (the search is over). Else if k=n−i+1, then i←i+1. Else, k←k+1. Go to Step 3.
3. If $C_1$, is the target tool for the cassette inside the tool $C_{i+k}$, go to Step 4. Else, go to Step 2.
4. Return i,k and $C_i$. Go to Step 2.

To identify a knot tool one needs two nested loops. The outer loop checks all tools that are finished processing for a potential knot tool. For any fixed value (fixed tool in the outer loop, say tool C, the inner loop checks tools downstream of C to find a tool which is finished processing and whose cassette has tool C as its target tool. If X is a tool downstream of C such that C is the target tool for the cassette in X, then C must be the knot tool.

In the algorithm below, C and X, stand for variables (tools) in the outer and inner loop, respectively. FirstTool and LastTool are the first and last tool in a given process sub-flow which is being examined for the knot tool. In the absence of a data structure representing the process flow graph, the algorithm must be run for each cassette (not only for the ones which are in the processing loop). If there is an adjacency matrix (or an adjacency list) representation of the cassette flow, only cassettes in the processing loop need to be checked.

Algorithm DD2.

Figure 9:
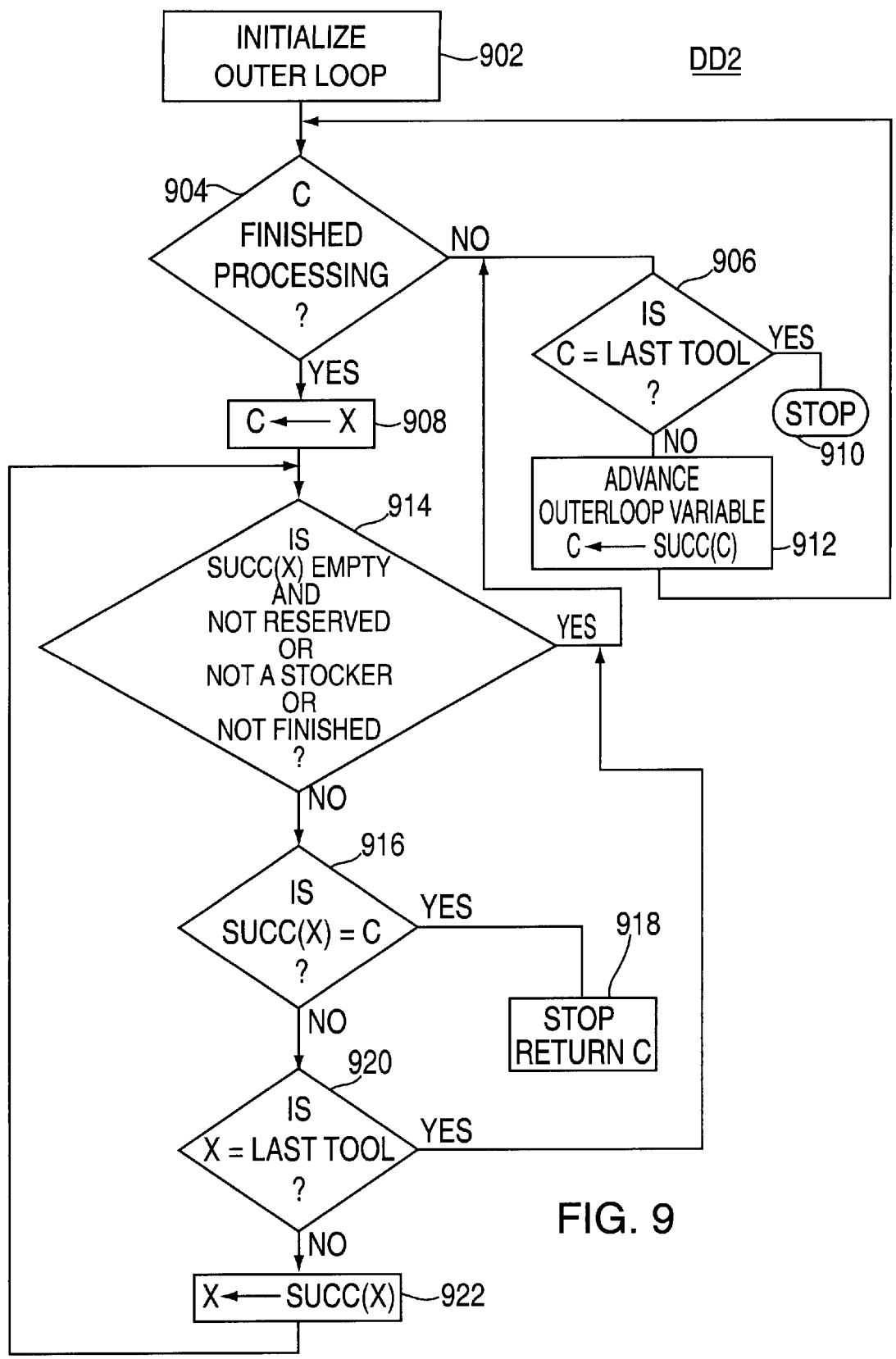
FIG. 9 depicts a flow diagram of a second embodiment of a process for detecting deadlocks.

The algorithm DD2 is shown as a flow diagram in FIG. 9.

Step 902. (Initialize the outer loop.) FirstTool←C. Go to Step 904.

Step 904. If tool C is not finished processing, go to Step 906. Else (C is finished processing), put C←X at step 908 and go to Step 914.

Step 906. If C=LastTool, STOP at step 910 (no circular wait found). Else (advance the variable in the outer loop) at step 912, C←succ(C) and go to Step 904.

Step 914. If succ(X) is empty and not reserved or succ(X) is a stocker or succ(X) is not finished processing, go to Step 906. Else go to step 916.

Step 916. If succ(X)=C, go to Step 918. Else, go to Step 920.

Step 918. Stop. Return C. (There is a circular wait and C is the knot tool. A cassette from C will go into deadlock handling partition.)

Step 920. If X=LastTool, go to Step 906. Else (advance the variable in the inner loop). X←succ(X) in step 922 and go to Step 914.

Again, the algorithm requires storing the adjacency matrix (or adjacency list) or a data structure from which an adjacency matrix can be derived. When adjacency matrix is used, the run-time complexity of the above algorithm is $O(n^2)$, where n is the number of tools.

Deadlock Resolution

Figure 10:
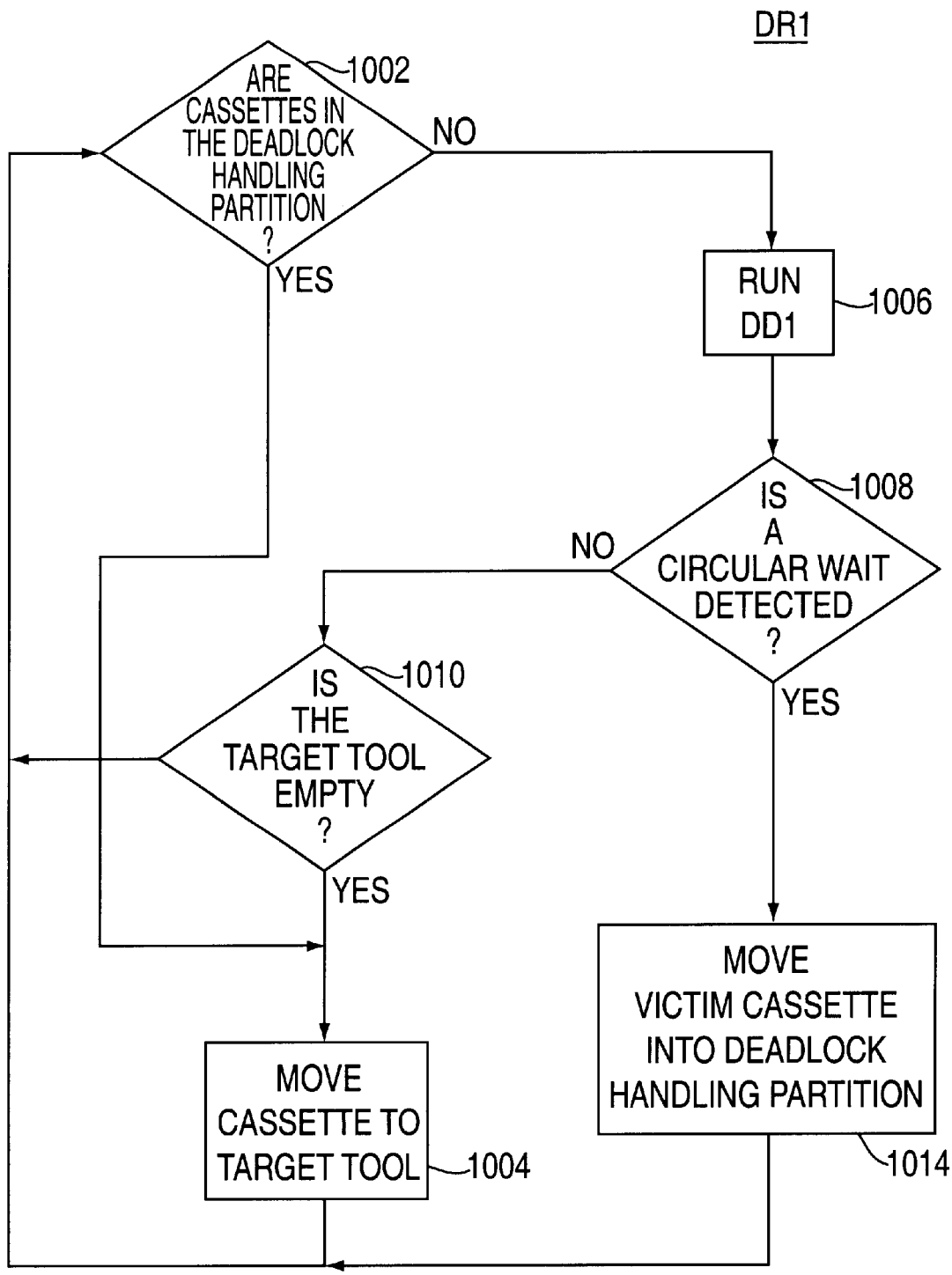
FIG. 10 depicts a flow diagram of a first embodiment of a process for resolving deadlocks.
Figure 11:
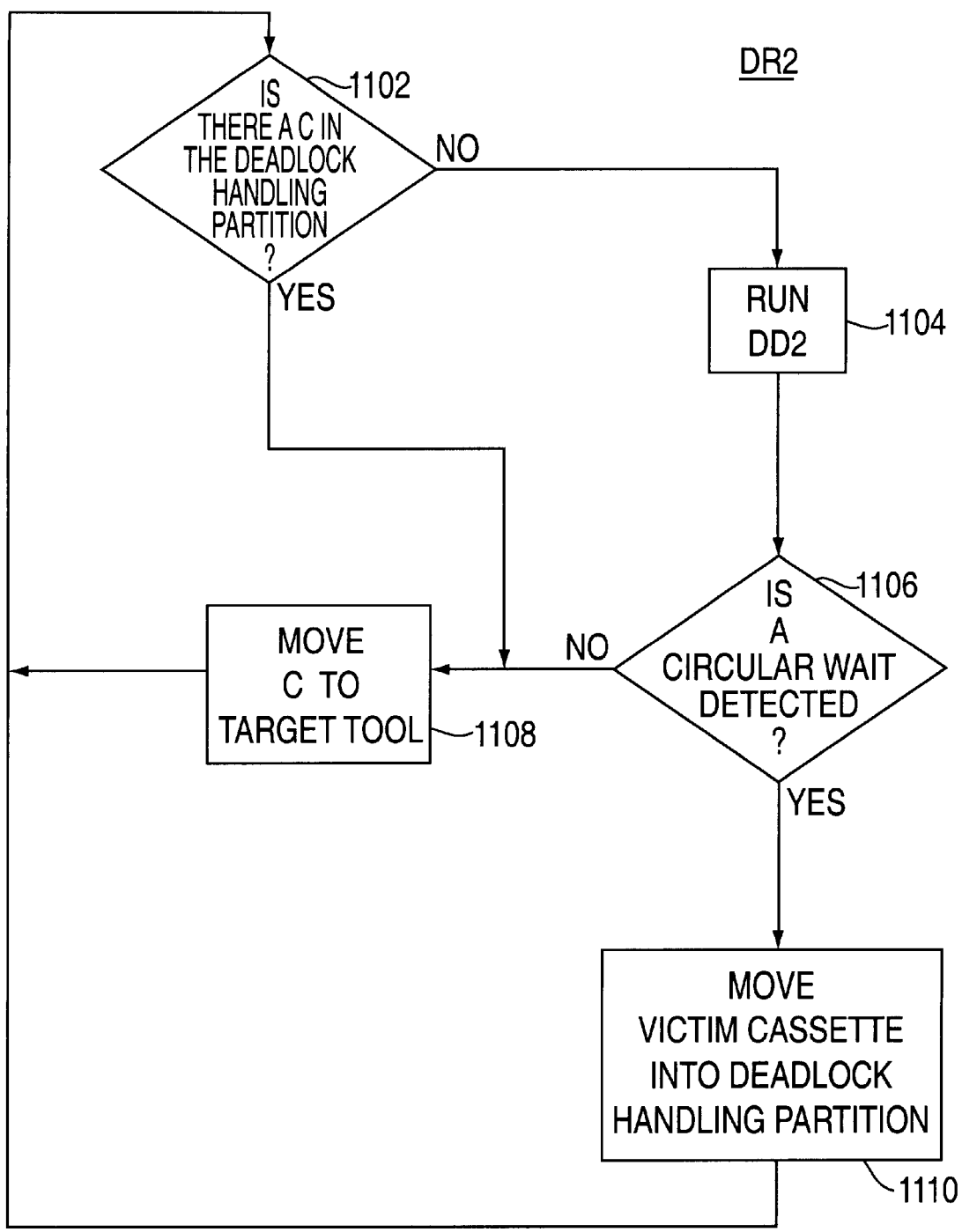
FIG. 11 depicts a flow diagram of a second embodiment of a process for resolving deadlocks.

Deadlock resolution (or breaking the deadlock) happens by tool preemption and should be done without loss of work and damage to the cassette. Deadlock resolution algorithms that contain deadlock detection algorithms DD1 and DD2, are given below and depicted as flow diagrams in FIGS. 10 and 11, respectively.

Algorithm DR1.

Step 1002. If there are no cassettes in the deadlock handling partition whose target tool is ready (i.e., empty and not busy clean), go to Step 1006. Else (there is a ready target tool) at step 1004, put the cassette into its target tool and go to Step 1002.

Step 1006. For each cassette that is finished processing, run deadlock detection algorithm DD1 and proceed to step 1008.

Step 1008. If circular wait is detected, go to Step 1014. Else (no circular wait), go to Step 1010.

Step 1010. If target tool is empty and not busy-maintenance, move the cassette into the tool at step 1004. Go to Step 1002.

Step 1014. Move the victim cassette(s) out of the processing loop into the deadlock handling partition (discretionary space in the tool or stocker). Go to Step 1002.

The choice of a target tool in Step 1010 is made according to the scheduling algorithm for the transport agent that does not have extra space to swap the cassettes. The same holds for returning cassettes from the deadlock handling partition into the processing loop. The highest priority here is given to a cassette whose target tool satisfies conditions of the scheduling algorithm at that moment. The victim cassette(s) in Step 1014 are chosen from the tools returned by DD1 that are marked done.

Algorithm DR2.

Step 1102. If there is no cassette in the deadlock handling partition whose target tool is ready (empty and not busy clean), go to Step 1104. Else (there is a ready target tool) at step 1108, put the cassette into its target tool and go to Step 1102.

Step 1104. For each cassette that is finished processing, run deadlock detection algorithm DD2.

Step 1106. If circular wait is detected, go to Step 1110. Else (there is no circular wait), go to Step 1108.

Step 1108. If target tool is empty and not busy clean (PM), move the cassette to the target tool. Go to Step 1102.

Step 1110. Move the victim cassette out of the knot tool into the deadlock handling partition of the stocker. Go to Step 1102.

There are two differences between deadlock resolution algorithms DR1 and DR2. First is in which deadlock detection algorithm is run in Step 2 (DD1 and DD2 for DR2). Second is in the choice of victim cassette(s) in Step 1110 or 1014. In DR1, they are determined by simulation ahead of time on a case by case basis to maximize the throughput; in DR2, victim cassette always comes from the knot tool (after all cassettes in the loop are finished processing).

Although various embodiments which incorporate the teachings of the present invention have been shown and described in detail herein, those skilled in the art can readily devise many other varied embodiments that still incorporate these teachings.

What is claimed is:

1. A method for performing congestion management in an integrated-circuit factory containing at least one stocker for storing wafer cassettes comprising:

initializing a product counter to a first value;

determining if a cassette is leaving or arriving at a stocker;

if the cassette is leaving, adding one to the product counter, and if the cassette is arriving, subtracting one from the product counter; and when the product counter attains a zero value, denying entry of cassette arrivals to the stocker.

2. The method of claim 1 wherein the first value is the space allotment for a particular product.

3. The method of claim 1 wherein information regarding cassette and stocker status is contained in a communication protocol.

* * * * *